(12) United States Patent
Suk et al.

(10) Patent No.: US 12,519,079 B2
(45) Date of Patent: Jan. 6, 2026

(54) METHOD OF MANUFACTURING SEMICONDUCTOR PACKAGE

(71) Applicant: SAMSUNG ELECTRONICS CO., LTD., Suwon-si (KR)

(72) Inventors: Kyounglim Suk, Suwon-si (KR); Daewoo Kim, Seongnam-si (KR); Seokhyun Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 851 days.

(21) Appl. No.: 17/730,551

(22) Filed: Apr. 27, 2022

(65) Prior Publication Data

US 2023/0049283 A1 Feb. 16, 2023

(30) Foreign Application Priority Data

Aug. 13, 2021 (KR) .................. 10-2021-0107148

(51) Int. Cl.
*H01L 23/00* (2006.01)
*H01L 21/56* (2006.01)
*H01L 21/768* (2006.01)

(52) U.S. Cl.
CPC ............ *H01L 24/80* (2013.01); *H01L 21/561* (2013.01); *H01L 21/76898* (2013.01); *H01L 24/19* (2013.01); *H01L 2224/80895* (2013.01); *H01L 2224/80896* (2013.01); *H01L 2924/1431* (2013.01); *H01L 2924/1432* (2013.01); *H01L 2924/1433* (2013.01); *H01L 2924/14335* (2013.01); *H01L 2924/1436* (2013.01);

(Continued)

(58) Field of Classification Search
CPC . H01L 24/80; H01L 21/561; H01L 21/76898; H01L 24/19; H01L 2224/80895; H01L 2224/80896; H01L 2924/1431; H01L 2924/1432; H01L 2924/1433; H01L 2924/14335; H01L 2924/1436; H01L 2924/1437; H01L 2924/1438; H01L 2924/1443; H01L 2924/1444; H01L 2924/182; H01L 2924/186; H01L 24/08; H01L 24/13; H01L 24/16; H01L 25/50; H01L 2225/06541; H01L 25/0652; H01L 23/293; H01L 23/291; H01L 23/481; H01L 24/94; H01L 2224/08145; H01L 2224/08235

See application file for complete search history.

(56) References Cited

U.S. PATENT DOCUMENTS 8,471,577 B2 6/2013 Stillman et al.
8,502,380 B2 * 8/2013 Liu .................. H01L 24/03
257/E23.068

(Continued)

*Primary Examiner* — Duy Vu N Deo
*Assistant Examiner* — Christopher Remavege
(74) *Attorney, Agent, or Firm* — Sughrue Mion, PLLC

(57) ABSTRACT

A method of manufacturing a semiconductor package includes: hybrid-bonding a semiconductor chip, including a through-silicon via, to an upper surface of a semiconductor wafer, wet-etching a surface of the semiconductor chip to expose the through-silicon via, covering the exposed through-silicon via with a material, including an organic resin and an inorganic filler, to form an encapsulation layer, removing an upper surface of the encapsulation layer to expose the through-silicon via, and forming a redistribution structure electrically connected to the through-silicon via.

20 Claims, 11 Drawing Sheets

(52) U.S. Cl.
CPC ............... *H01L 2924/1437* (2013.01); *H01L 2924/1438* (2013.01); *H01L 2924/1443* (2013.01); *H01L 2924/1444* (2013.01); *H01L 2924/182* (2013.01); *H01L 2924/186* (2013.01)

(56) References Cited

U.S. PATENT DOCUMENTS

| | | | |
|---|---|---|---|
| 9,099,541 B2* | 8/2015 | Kim | H01L 21/563 |
| 9,653,642 B1* | 5/2017 | Raring | H10H 20/0133 |
| 9,691,685 B2 | 6/2017 | Lee et al. | |
| 9,768,048 B2* | 9/2017 | Lin | H01L 21/563 |
| 9,941,190 B2* | 4/2018 | Gandhi | H01L 24/05 |
| 10,269,721 B2* | 4/2019 | Lee | H01L 24/20 |
| 10,510,650 B2 | 12/2019 | Yu et al. | |
| 10,593,647 B2* | 3/2020 | Chang Chien | H01L 25/0657 |
| 10,727,198 B2 | 7/2020 | Hsu et al. | |
| 10,872,834 B2 | 12/2020 | Chew | |
| 2009/0239336 A1* | 9/2009 | Lee | H01L 21/6835 257/E21.705 |
| 2009/0243097 A1* | 10/2009 | Koroku | H01L 23/3135 257/737 |
| 2010/0109169 A1* | 5/2010 | Kolan | H01L 25/0655 257/E23.116 |
| 2011/0186960 A1* | 8/2011 | Wu | H01L 23/147 257/E21.705 |
| 2012/0001326 A1* | 1/2012 | Tay | H01L 24/18 257/737 |
| 2015/0043190 A1* | 2/2015 | Mohammed | H01L 24/20 29/842 |
| 2017/0338214 A1* | 11/2017 | Uzoh | H01L 21/3081 |
| 2018/0294241 A1 | 10/2018 | Chen et al. | |
| 2019/0237430 A1* | 8/2019 | England | H01L 21/486 |
| 2019/0252324 A1* | 8/2019 | Shen | H01L 24/16 |
| 2019/0393194 A1* | 12/2019 | Chen | H01L 24/92 |
| 2020/0043782 A1* | 2/2020 | Teng | H01L 23/3128 |
| 2020/0066663 A1* | 2/2020 | Aleksov | H01L 23/00 |
| 2020/0098731 A1* | 3/2020 | Chen | H01L 23/481 |
| 2020/0273817 A1* | 8/2020 | Choi | H01L 21/4853 |
| 2020/0303361 A1* | 9/2020 | Shih | H01L 24/33 |
| 2020/0381397 A1 | 12/2020 | Yu et al. | |
| 2021/0057362 A1 | 2/2021 | Chen et al. | |
| 2021/0066168 A1 | 3/2021 | Chen et al. | |
| 2021/0066192 A1* | 3/2021 | Chen | H01L 23/5227 |
| 2021/0066254 A1 | 3/2021 | Yu et al. | |
| 2021/0082874 A1 | 3/2021 | Chen et al. | |
| 2021/0091064 A1* | 3/2021 | Chen | H01L 24/96 |
| 2021/0098380 A1 | 4/2021 | Chen et al. | |
| 2021/0125960 A1* | 4/2021 | Huang | H01L 25/50 |
| 2021/0167024 A1* | 6/2021 | Tsai | H01L 21/78 |
| 2021/0407941 A1* | 12/2021 | Haba | H01L 23/562 |
| 2022/0310470 A1* | 9/2022 | Chen | H01L 25/0652 |
| 2022/0310480 A1* | 9/2022 | Bao | H01L 24/19 |

* cited by examiner

'A'

METHOD OF MANUFACTURING SEMICONDUCTOR PACKAGE

CROSS-REFERENCE TO RELATED APPLICATION(S)

This application claims priority to Korean Patent Application No. 10-2021-0107148, filed on Aug. 13, 2021 in the Korean Intellectual Property Office, the disclosure of which is incorporated by reference herein in its entirety.

BACKGROUND

The present disclosure relates to a method of manufacturing a semiconductor package.

Semiconductor packages, which are mounted on electronic devices, need to have high performance and high capacity. Moreover, the semiconductor packages have to be miniaturized to fit in smaller electronic devices. To this end, research and development of semiconductor packages, in which semiconductor chips having through-silicon vias (TSV) are vertically staked, has been conducted.

SUMMARY

Example embodiments provide a method of manufacturing a semiconductor package having improved reliability.

According to an example embodiment, a method of manufacturing a semiconductor package includes: forming a first insulating layer and a first electrode pad, penetrating through the first insulating layer, on one surface of a semiconductor substrate including a through-silicon via, to form a semiconductor chip, forming a second insulating layer and a second electrode pad, penetrating through the second insulating layer, on an upper surface of a semiconductor wafer, bonding the first insulating layer and the first electrode pad of the semiconductor chip to the second insulating layer and the second electrode pad of the semiconductor wafer, respectively, to mount the semiconductor chip on the semiconductor wafer, etching an upper surface of the semiconductor chip to expose the through-silicon via, covering the exposed through-silicon via with a first material to form a first encapsulation layer, covering the first encapsulation layer with a second material with a second material including an organic resin and an inorganic filler to form a second encapsulation layer, grinding an upper surface of the second encapsulation layer to expose the through-silicon via, and forming a redistribution structure, electrically connected to the exposed through-silicon via, on the upper surface of the second encapsulation layer.

According to an example embodiment, a method of manufacturing a semiconductor package includes: hybrid-bonding a semiconductor chip, including a through-silicon via, to an upper surface of a semiconductor wafer, wet-etching a surface of the semiconductor chip to expose the through-silicon via, covering the exposed through-silicon via with a material, including an organic resin and an inorganic filler, to form an encapsulation layer, removing an upper surface of the encapsulation layer to expose the through-silicon via, and forming a redistribution structure electrically connected to the through-silicon via.

According to an example embodiment, a method of manufacturing a semiconductor package includes: forming a first insulating layer and a first electrode pad, penetrating through the first insulating layer, on one surface of a semiconductor substrate including a through-silicon via, to form a semiconductor chip, forming a second insulating layer and a second electrode pad, penetrating through the second insulating layer, on an upper surface of a semiconductor wafer, bonding the first insulating layer and the first electrode pad of the semiconductor chip to the second insulating layer and the second electrode pad of the semiconductor wafer, respectively, to mount the semiconductor chip on the semiconductor wafer, etching an upper surface of the semiconductor chip to expose the through-silicon via, covering the exposed through-silicon via with a material, including an organic resin and an inorganic filler, to form an encapsulation layer, removing an upper portion of the encapsulation layer to expose the through-silicon via, and forming a redistribution structure, electrically connected to the exposed through-silicon via, on the upper surface of the encapsulation layer.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments will be described with reference to the accompanying drawings.

Figure 1:
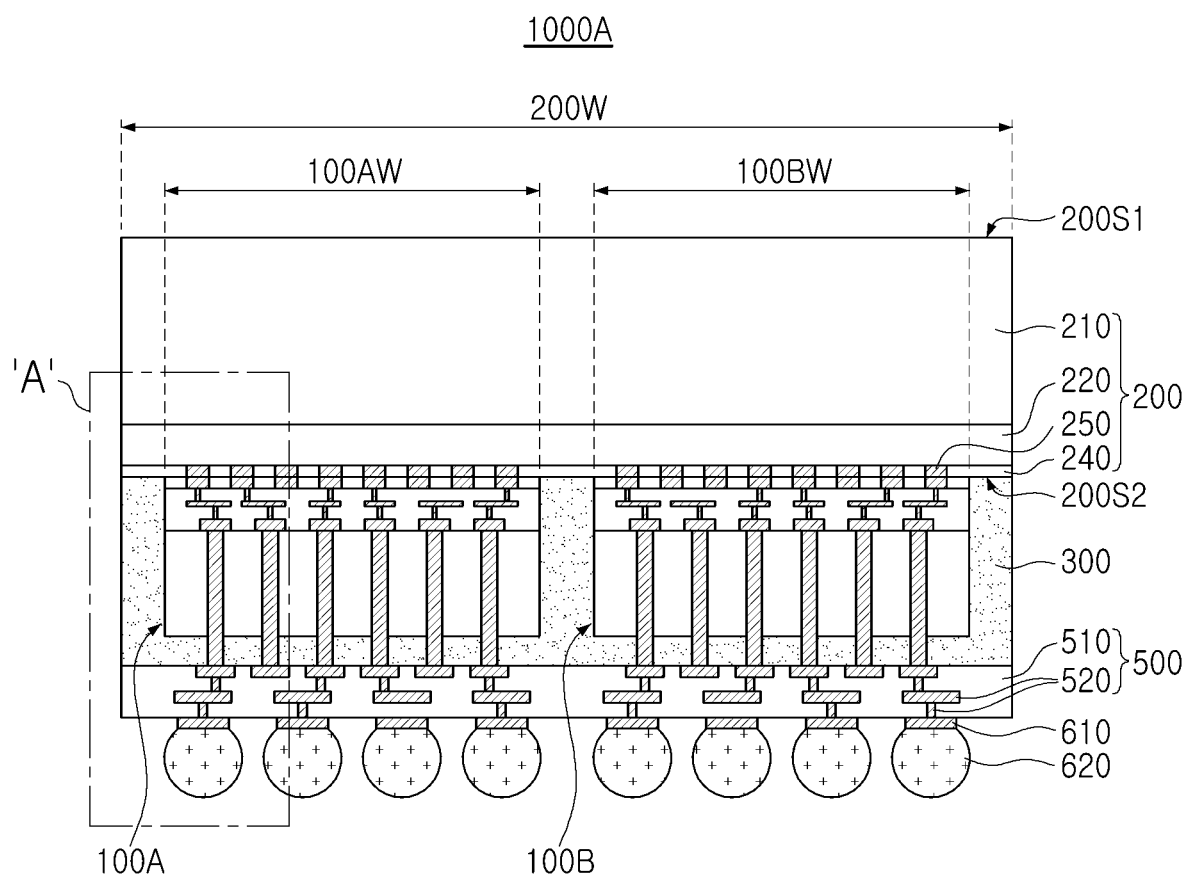
FIG. 1 is a cross-sectional view of a semiconductor package according to an example embodiment.
Figure 2:
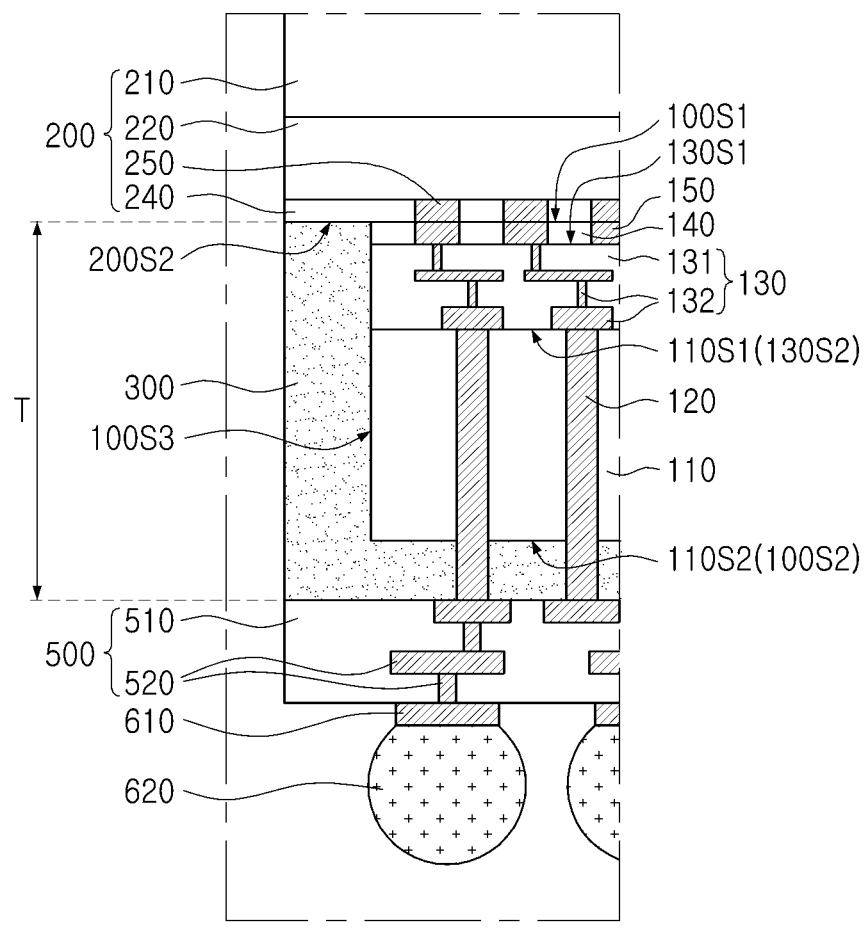
FIG. 2 is an enlarged view of portion 'A' of FIG. 1.

A semiconductor package according to an example embodiment will be described with reference to FIGS. 1 and 2. FIG. 1 is a cross-sectional view of a semiconductor package according to an example embodiment, and FIG. 2 is an enlarged view of portion 'A' of FIG. 1.

Figure 3:
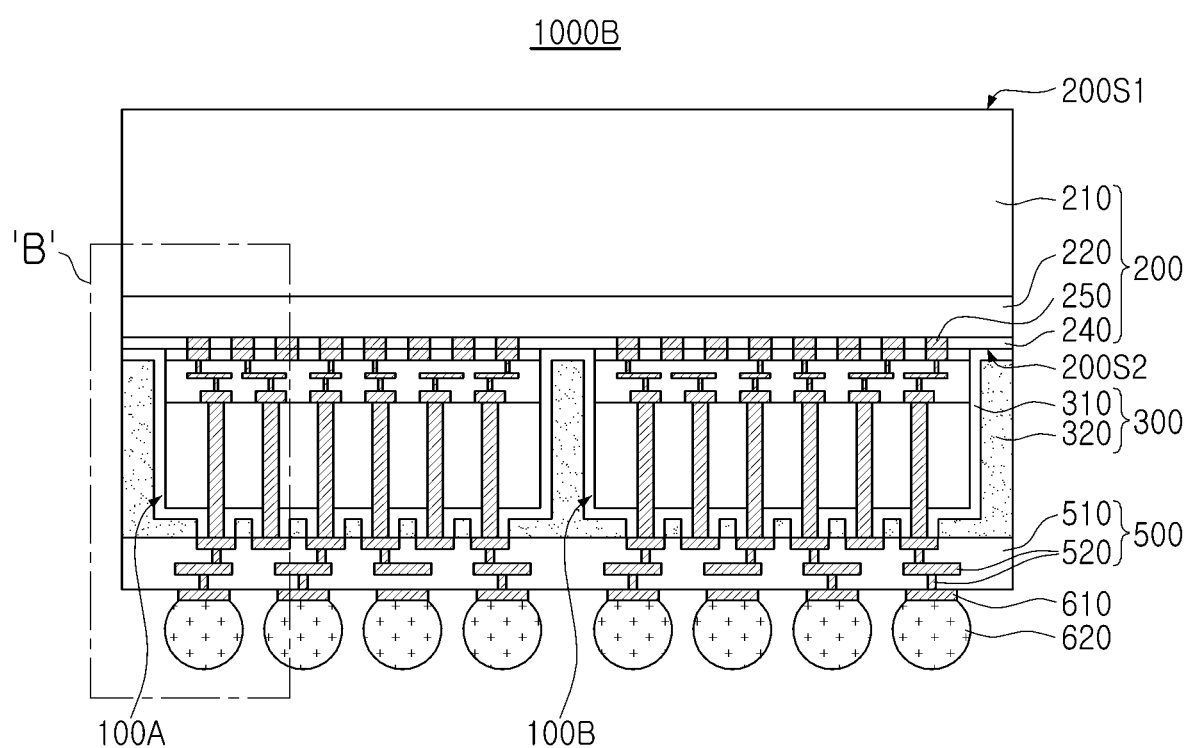
FIG. 3 is a cross-sectional view of a semiconductor package according to an example embodiment.

Referring to FIGS. 1 and 3, a semiconductor package 1000A according to an example embodiment may include a first semiconductor chip 200 having an upper surface 200S1 and a lower surface 200S2, a second semiconductor chip 100A, a third semiconductor chip 100B disposed on the lower surface 200S2 of the first semiconductor chip 200, an encapsulation layer 300, a redistribution structure 500, a lower electrode pad 610, and a connection bump 620. In the example embodiment, the second semiconductor chip 100A and the third semiconductor chip 100A and 100B are described as being disposed on the lower surface 200S2 of the first semiconductor chip 200, but example embodiments are not limited thereto. According to example embodiments, a single semiconductor chip may be disposed on the lower surface 200S2 of the first semiconductor chip 200, or three or more semiconductor chips may be disposed on the lower surface 200S2 of the first semiconductor chip 200. For example, only one of the second semiconductor chip 100A and the third semiconductor chip 100B may be provided on the lower surface 200S2 of the first semiconductor chip 200. In the example embodiment, the second semiconductor chip 100A and the third semiconductor chip 100B are described as having the same configuration, but example embodiments are not limited thereto. According to example embodiments, the second semiconductor chip 100A and the third semiconductor chip 100B may have different configurations.

The first semiconductor chip 200, the second semiconductor chip 100A and the third semiconductor chip 100B may have a hybrid bonding structure in which they are directly attached without an additional connection member (for example, a solder bump, a copper pillar, and the like). For example, a first insulating layer 240 of the first semiconductor chip 200 and a second insulating layer 140 of the second semiconductor chip 100A and the third semiconductor chip 100B may be directly bonded to each other. In addition, a first electrode pad 250 of the first semiconductor chip 200 and a second electrode pad 150 of the second semiconductor chip 100A and the third semiconductor chip 100B may be electrically connected to each other and may be directly bonded to each other.

The first semiconductor chip 200, the second semiconductor chip 100A and the third semiconductor chip 100B may be a memory semiconductor chip or a logic semiconductor chip. For example, the memory semiconductor chip is a volatile memory chip such as a dynamic random access memory (DRAM) or a static random access memory (SRAM), or a nonvolatile memory chip such as a phase-change random access memory (PRAM), a magnetic random access memory (MRAM), a ferroelectric random access memory (FeRAM), or a resistive random access memory (RRAM), and the logic semiconductor chip may be a microprocessor, an analog device, or a digital signal processor.

The first semiconductor chip 200 may include a first substrate 210, a first device layer 220, a first insulating layer 240, and a first electrode pad 250. The first semiconductor chip 200 may receive an input/output signal through the second semiconductor chip 100A and the third semiconductor chip 100B.

The first substrate 210 may include a semiconductor material. The first substrate 210 may be obtained by dicing a semiconductor wafer in units of individual devices. The first substrate 210 may include a semiconductor element such as silicon (Si) or germanium (Ge), or may include a compound semiconductor such as silicon carbide (SiC), gallium arsenide (GaAs), indium arsenide (InAs), or indium phosphide (InP). The first substrate 210 may have a silicon-on-insulator (SOI) structure. The first substrate 210 may include a conductive region, for example, a well doped with impurities or a structure doped with impurities. The first substrate 210 may include various device isolation structures such as a shallow trench isolation (STI) structure.

The first device layer 220 may be disposed on a lower surface of the first substrate 210, and may include various types of devices. For example, the first device layer 220 may include a field effect transistor (FET) such as a planar FET or a FinFET, a memory device such as a flash memory, a dynamic random access memory (DRAM), a static random access memory (SRAM), an electrically erasable programmable read-only memory (EEPROM), a phase-change random access memory (PRAM), a magnetoresistive random access memory (MRAM), a ferroelectric random access memory (FeRAM), a resistive random access memory (RRAM), a logic device such as AND, OR, NOT, and the like, and various active and/or passive devices such as a system large scale integration (LSI), a CMOS imaging sensor (CIS), and a micro-electro-mechanical system (MEMS).

The first insulating layer 240 may be disposed to cover a lower surface of the first device layer 220. The first insulating layer 240 may be formed of an insulating material. For example, the first insulating layer 240 may be formed of silicon oxide. However, the first insulating layer 240 is not limited to silicon oxide and may be formed of SiCN, or the like. In addition, the first insulating layer 240 may be formed in a multilayer structure including tetraethylorthosilicate (TEOS) and PE-SiN.

The first electrode pad 250 may penetrate through the first insulating layer 240 to be disposed below the first device layer 220, and may be connected to the devices of the first device layer 220 through an interconnection of a multilayer interconnection layer. The first electrode pad 250 may have cylindrical shape or a polygonal pillar-like shape such as a square pillar shape or an octagonal pillar shape, and may be formed of, for example, nickel (Ni), copper (Cu), palladium (Pd), platinum (Pt), gold (Au), or combinations thereof.

The second semiconductor chip 100A and the third semiconductor chip 100B may be disposed on a lower surface 200S2 of the first semiconductor chip 200. Each of the second semiconductor chip 100A and the third semiconductor chip 100B may include a second substrate 110, a second device layer 130, a second insulating layer 140, a second electrode pad 150, and a through-silicon via (TSV) 120. The second semiconductor chip 100A and the third semiconductor chip 100B may have a size smaller than that of the first semiconductor chip 200. For example, in a direction parallel to the lower surface 200S2 of the first semiconductor chip 200, a width 200W of the first semiconductor chip 200 may be greater than the sum of a width 100AW of the second semiconductor chip 100A and a width 100BW of the third semiconductor chip 100B. In an example embodiment, since the second semiconductor chip 100A and the third semiconductor chip 100B have the same configuration, only the second semiconductor chip 100A will be described below. In addition, since the second semiconductor chip 100A may include technical features the same as or similar to those of the above-described first semiconductor chip 200, a redundant description will be omitted.

The second semiconductor chip 100A may be, for example, a buffer chip in which a plurality of logic devices and/or memory devices are included in the second device layer 130. Accordingly, the second semiconductor chip 100A may transmit a signal from the first semiconductor chip 200 stacked thereon to an external entity, and may also transmit external signals and power to the first semiconductor chip 200. The second semiconductor chip 100A may perform both logic functions and memory functions through logic devices and memory devices. However, according to example embodiments, the second semiconductor chip 100A may include only logic devices to perform only logic functions.

Similarly to the first substrate 210, the second substrate 110 may include a semiconductor material such as silicon (Si).

The second device layer 130 may be disposed on an upper surface 110S1 of the second substrate 110 and may include various types of device, similarly to the first device layer 220. The second device layer 130 may include an interlayer insulating layer 131 and a multilayer interconnection layer 132. The interlayer insulating layer 131 may include silicon oxide or silicon nitride. The multilayer interconnection layer 132 may include multilayer interconnections and/or vertical contacts. The multilayer interconnection layer 132 may connect the devices of the second device layer 130 to each other, or may connect the devices of the second device layer 130 to a conductive region of the second substrate 110.

The second insulating layer 140 may be disposed on an upper surface 130S1 of the second device layer 130. The second insulating layer 140 may be formed of an insulating material, similarly to the first insulating layer 240. For example, the second insulating layer 140 may be formed of silicon oxide, SiCN, or the like, in the same manner as the first insulating layer 240. In addition, the second insulating layer 140 may be formed in a multilayer structure including tetraethylorthosilicate (TEOS) and PE-SiN.

The second electrode pad 150 may penetrate through the second insulating layer 140 to be disposed on the second device layer 130, and may be connected the devices of the second device layer 130 through an interconnection of the multilayer interconnection layer 132. The second electrode pad 150 may be disposed in a position corresponding to the first electrode pad 250 of the first semiconductor chip 200. For example, the second electrode pad 150 may have be provided at a same location as to the first electrode pad 250 so that the second electrode pad 150 may be in contact with the first electrode pad 250. For example, the first electrode pad 250 may be in contact with an upper surface 100S1 of the second electrode pad 150. The second electrode pad 150 may be formed to have a shape corresponding to the first electrode pad 250. For example, the second electrode pad 150 may have a same shape and/or size as to the first electrode pad 250. The second electrode pad 150 may be formed of the same material as the first electrode pad 250. For example, the second electrode pad 150 may be formed of nickel (Ni), copper (Cu), palladium (Pd), platinum (Pt), gold (Au), or combinations thereof.

The through-silicon via 120 may be formed through the upper surface 110S1 and the lower surface 110S2 of the second substrate 110, and may protrude from the lower surface 110S2 of the second substrate 110 to be connected to a redistribution structure 500. The through-silicon via 120 may provide an electrical path for electrically connecting the second device layer 130 and the redistribution structure 500 to each other. The through-silicon via 120 may connect the multilayer interconnection layer 132, disposed on a lower surface 130S2 of the second device layer 130, to the redistribution structure 500. An upper region of the through-silicon via 120 may be surrounded by the second substrate 110, and a lower region of the through-silicon via 120 may protrude from the lower surface 110S2 of the second substrate 110 to be surrounded by the encapsulation layer 300.

The through-silicon via 120 may include a conductive plug and a barrier layer surrounding the conductive plug. The conductive plug may include a metal material, for example, tungsten (W), titanium (Ti), aluminum (Al), or copper (Cu). The conductive plug may be formed by a plating process, a physical vapor deposition (PVD) process, or a chemical vapor deposition (CVD) process. The barrier layer may include an insulating barrier layer and/or a conductive barrier layer. The insulating barrier layer may be formed of oxide, nitride, carbide, a polymer, or combinations thereof. A conductive barrier layer may be disposed between the insulating barrier layer and the conductive plug. The conductive barrier layer may include, for example, a metal compound such as tungsten nitride (WN), titanium nitride (TiN), or tantalum nitride (TaN). The barrier layer may be formed by a PVD process or a CVD process.

The encapsulation layer 300 may fill and encapsulate a space between the first semiconductor chip 200, the second semiconductor chip 100A and the third semiconductor chip 100B and the redistribution structure 500. For example, the encapsulation layer 300 may be formed to cover a lower surface 200S2 of the first semiconductor chip 200 and a lower surface 100S2 and a side surface 100S3 of the second semiconductor chip 100A and the third semiconductor chip 100B and to be in contact with the redistribution structure 500. The encapsulation layer 300 may fill a space between the second and third semiconductor chips 100A and 100B mounted on a lower surface 200S of the first semiconductor chip 200. Also, the encapsulation layer 300 may encapsulate the side surfaces of the through-silicon vias 120 protruding from the second semiconductor chip 100A and the third semiconductor chip 100B.

The encapsulation layer 300 may be formed of a material in which an organic resin and an inorganic filler are mixed. For example, the encapsulation layer 300 may be formed of an epoxy molding compound (EMC) in which an inorganic filler such as silicon oxide or silicon nitride is included in a thermosetting resin such as an epoxy resin. Therefore, the encapsulation layer 300 according to an example embodiment may have a relatively high modulus, as compared with a case in which the encapsulation layer is formed of only silicon oxide or silicon nitride. The encapsulation layer 300 may have a thickness varying depending on a region. However, in a region between the first semiconductor chip 200 and the redistribution structure 500 in which the second semiconductor chip 100A and the third semiconductor chip 100B are not disposed, the encapsulation layer 300 may be formed to have a thickness T of about 20 μm.

The redistribution structure 500 may include an interlayer insulating layer 510 and a redistribution layer 520. The redistribution structure 500 may electrically connect the second semiconductor chip 100A and the third semiconductor chip 100B to the lower electrode pad 610, and may be disposed on a lower surface of the encapsulation layer 300. The redistribution layer 520 may include one or more redistribution lines extending in a horizontal direction and one or more redistribution vias extending in a vertical direction. The redistribution structure 430 may have a single-layer structure or a multilayer structure. The interlayer insulating layer 510 may include silicon oxide or silicon nitride.

The lower electrode pad 610 may be disposed on a lower surface of the redistribution structure 500. The lower electrode pad 610 may be connected to the redistribution layer 520 of the redistribution structure 500. A connection bump 620 may be connected to the lower electrode pad 610.

The connection bump 620 may be in the form of a land, a ball, or a pin. The connection bump 620 may include, for example, tin (Sn) or a tin-containing alloy (for example, Sn—Ag—Cu). The connection bump 620 may be in contact with the lower electrode pad 610 and may be electrically connected to the lower electrode pad 610. The connection bump 620 may physically and/or electrically connect the semiconductor package 1000A to an additional board.

In the semiconductor package 1000A having the above-described structure, the encapsulation layer 300 may be formed of a high-modulus material such as a material in which an inorganic filler is mixed with an organic resin. Therefore, thermal cycle (TC) reliability in board level reliability (BLR) may be improved, as compared with a case in which the encapsulation layer 300 is formed of only a low-modulus material such as silicon oxide or silicon nitride.

The TC reliability may be measured through a test in which a temperature is repeatedly increased and decreased at a board level to check whether reliability is maintained to a predetermined number of times. When the encapsulation layer 300 is formed of a low-modulus material, cracking may occur during repeated expansion and contraction of the encapsulation layer 300 due to heat. In an example embodiment, since the encapsulation layer 300 is formed of a high-modulus material, cracking may be prevented from occurring even when the encapsulation layer 300 is repeatedly expanded and contracted by heat. Accordingly, the reliability of the semiconductor package 1000A may be improved.

Figure 4:
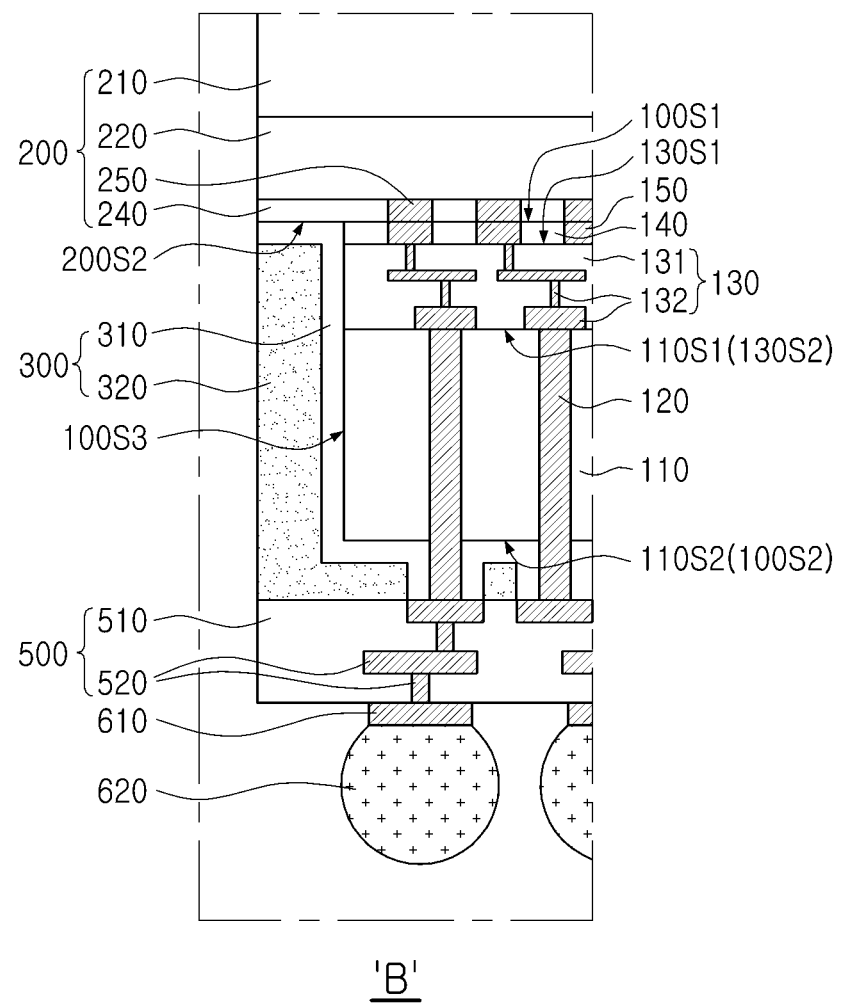
FIG. 4 is an enlarged view of portion 'B' of FIG. 3.

A semiconductor package 1000B according to an example embodiment will be described with reference to FIGS. 3 and 4. FIG. 3 is a cross-sectional view of a semiconductor package according to an example embodiment, and FIG. 4 is an enlarged view of portion 'B' of FIG. 3. In FIGS. 3 and 4, the same reference numerals as those of FIGS. 1 and 2 have characteristics the same as or similar to the above-described characteristics, so that redundant descriptions will be omitted.

The semiconductor package 1000B according to an example embodiment may include an encapsulation layer 300 including a first encapsulation layer 310 and a second encapsulation layer 320, as compared with the above-described semiconductor package 1000A. The first encapsulation layer 310 may surround a side surface of the through-silicon via 120, and may cover a lower surface 200S2 of the first semiconductor chip 200 as well as a lower surface 100S2 and a side surface 100S3 of the second semiconductor chip 100A and the third semiconductor chip 100B. The second encapsulation layer 320 may be formed to cover the first encapsulation layer 310.

The first encapsulation layer 310 may be formed of silicon oxide or silicon nitride. The second encapsulation layer 320 may be formed of a material, in which an organic resin and an inorganic filler are mixed, in the same manner as the encapsulation layer 300 in the above-described embodiment illustrated in FIGS. 1 and 3. The first encapsulation layer 310 may be understood as a type of passivation layer preventing voids from being formed between the through-silicon vias 120. When the through-silicon vias 120 are formed to have a microstructure, it may be difficult for an encapsulation layer, formed of an organic resin, to flow into a space between the through-silicon vias 120, and thus, voids may be formed between the through-silicon vias 120. Since the first encapsulation layer 310 formed of silicon oxide or silicon nitride may easily flow into a space between the through-silicon vias 120 formed to have a microstructure, compared with the second encapsulation layer 320, voids may be prevented from being formed between the through-silicon vias.

Figure 5:
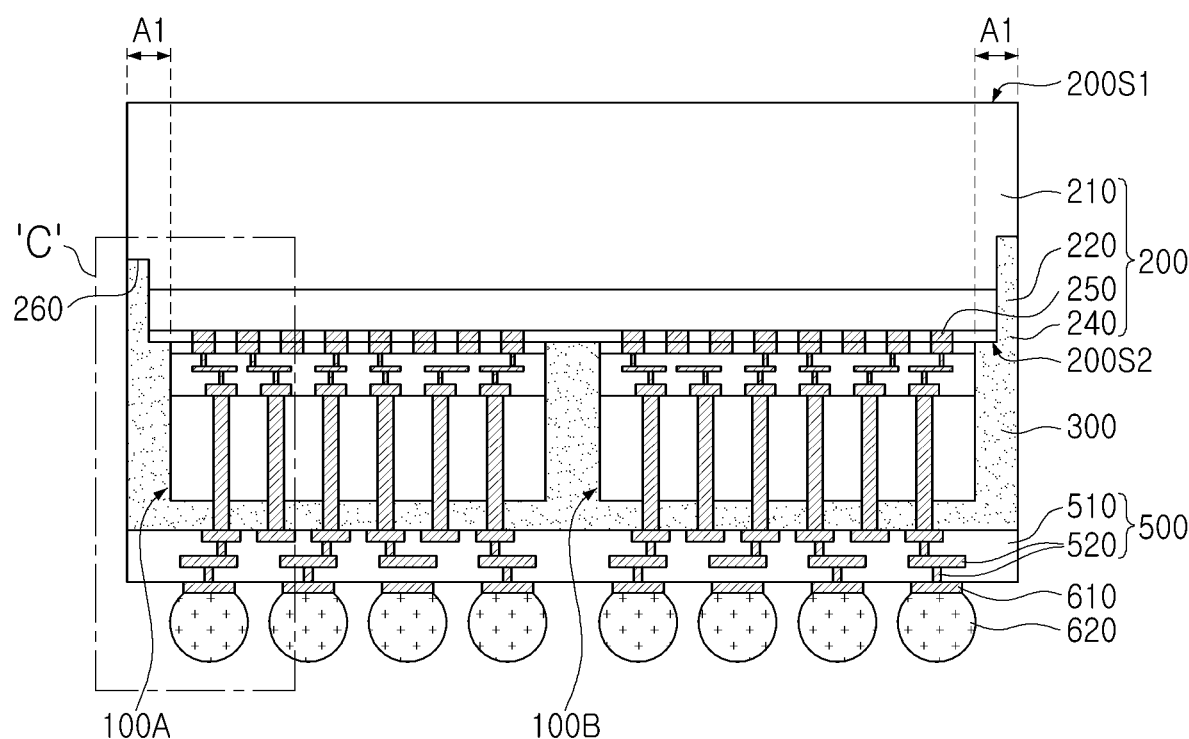
FIG. 5 is a cross-sectional view of a semiconductor package according to an example embodiment.
Figure 6:
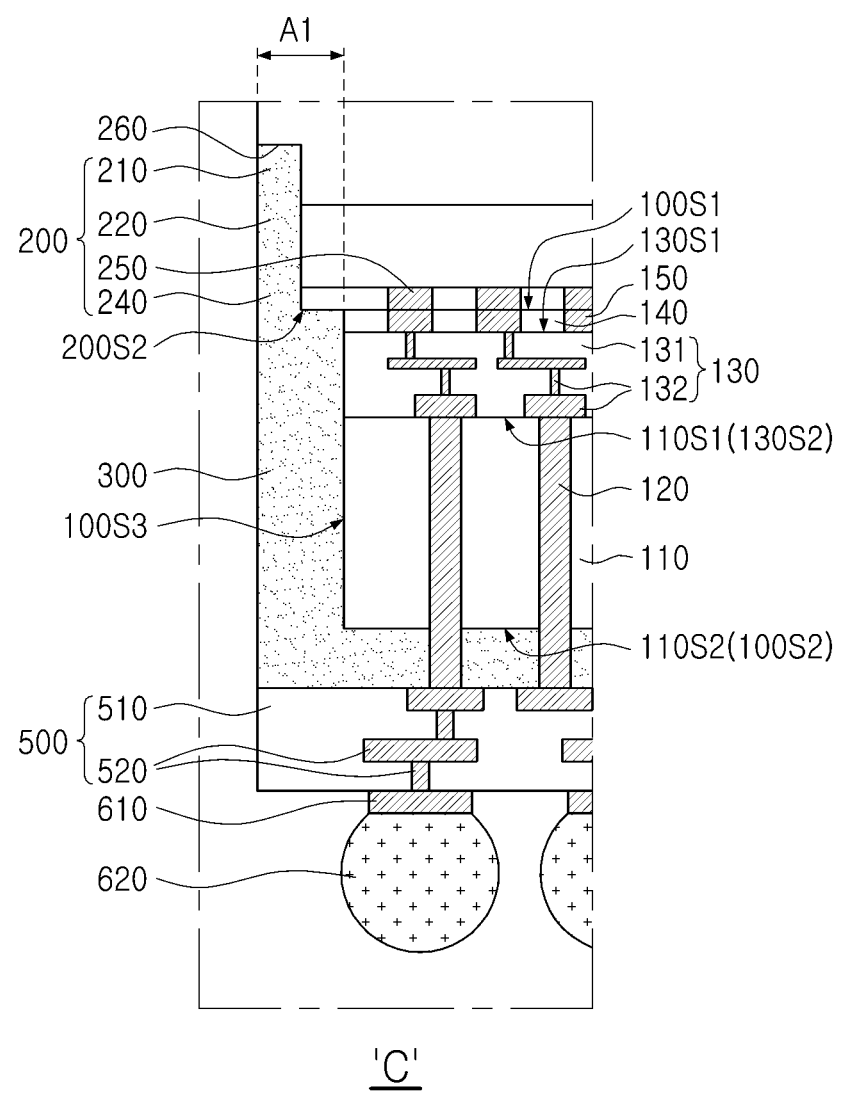
FIG. 6 is an enlarged view of portion 'C' of FIG. 5.

A semiconductor package 1000C according to an example embodiment will described with reference to FIGS. 5 and 6. FIG. 5 is a cross-sectional view of a semiconductor package according to an example embodiment, and FIG. 6 is an enlarged view of portion 'C' of FIG. 5. In FIGS. 5 and 6, the same reference numerals as those of FIGS. 1 and 2 have characteristics the same as or similar to the above-described characteristics, so that redundant descriptions will be omitted.

The semiconductor package 1000C according to an example embodiment may have a recess 260 formed in a peripheral region A1 of a first semiconductor chip 200, as compared with the above-described semiconductor package 1000A. The recess 260 may be formed to extend to a side surface of the first substrate 210. For example, the recess 260 may be formed to a depth sufficient to expose the first substrate 210 in the peripheral region A1 of the first semiconductor chip 200. The encapsulation layer 300 may fill the recess 260 of the first semiconductor chip 200. Accordingly, a side surface of the first device layer 220 of the first semiconductor chip 200 may be protected by the encapsulation layer 300.

Figure 7:
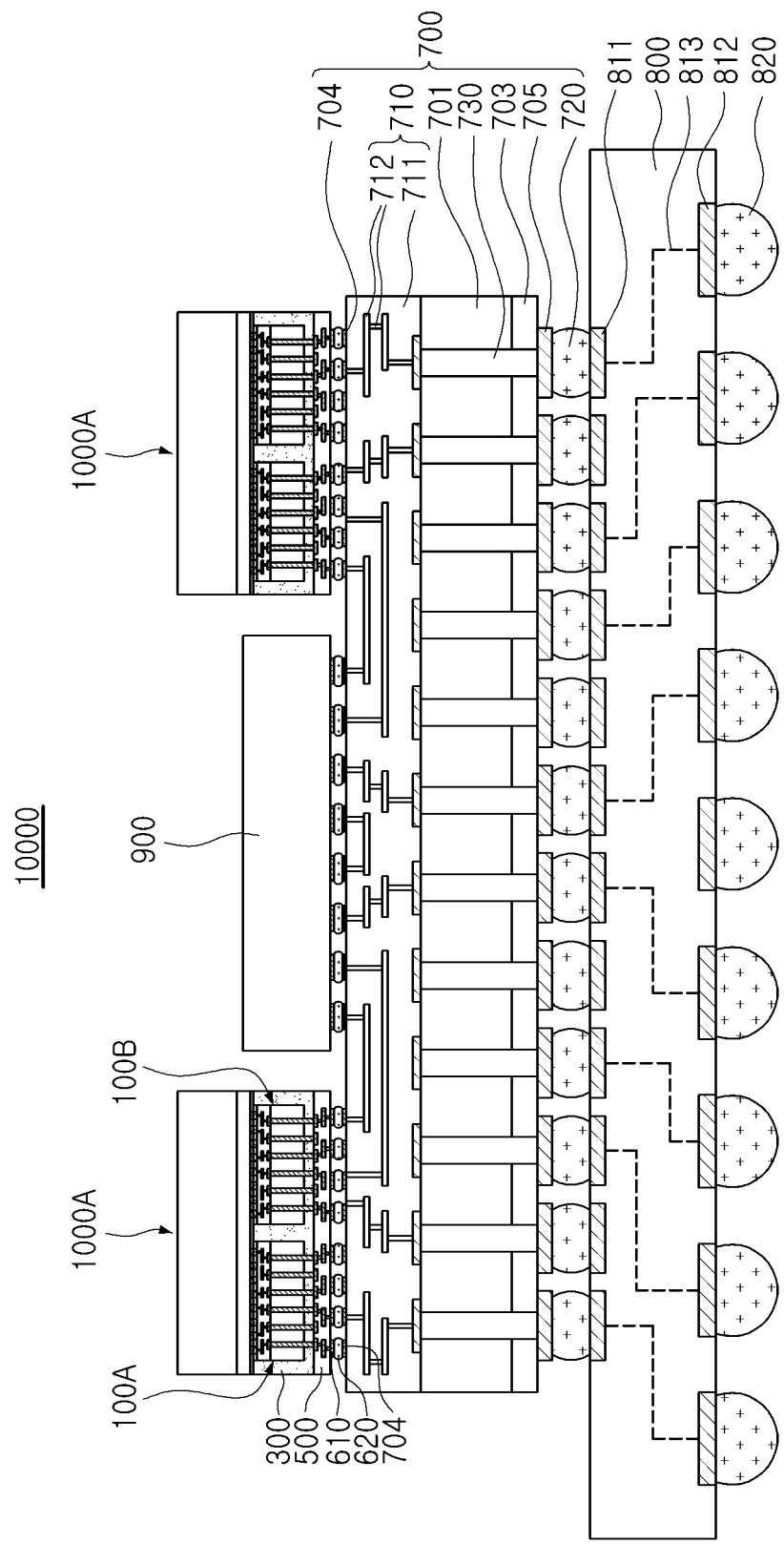
FIG. 7 is a cross-sectional view of a semiconductor package according to an example embodiment.

A semiconductor package according to an example embodiment will be described with reference to FIG. 7. FIG. 7 is a cross-sectional view of a semiconductor package according to an example embodiment.

Referring to FIG. 7, a semiconductor package 10000 according to an example embodiment may include a package substrate 800, an interposer substrate 700, and at least one semiconductor structure 1000A. According to an example embodiment illustrated in FIG. 7, two semiconductor structures 1000A are shown. However, the disclosure is not limited thereto, and as such, according to another example embodiment more than semiconductor structures 1000A may be are provided. In addition, the semiconductor package 10000 may further include a semiconductor chip 900 disposed adjacent to the semiconductor structure 1000A on the interposer substrate 700. The semiconductor structure 1000A according to an example embodiment may have the same configuration as the semiconductor package 1000A described with reference to FIGS. 1 and 2.

The package substrate 800 may include lower pads 812 disposed on a lower surface of a body, upper pad 811 disposed on an upper surface of the body, and redistribution circuits 813 electrically connecting the lower pads 812 and the electrode pads 811 to each other. The package substrate 800 may be a support substrate on which the interposer substrate 700 is mounted, and may be a substrate for a semiconductor package including a printed circuit board (PCB), a ceramic substrate, a glass substrate, a tape interconnection substrate, or the like. The body of the package substrate 800 may include different materials according to the type of a substrate. For example, when the package substrate 800 is a printed circuit board, the printed circuit board may be in a form in which an interconnection layer is additionally stacked on a single surface or both surfaces of a body copper-clad laminate or a copper-clad laminate. Solder resist layers may be formed on lower and upper surfaces of the package substrate 800, respectively. The lower pad 812, the upper pad 811, and the redistribution circuits 813 may form an electrical path for connecting a lower surface and an upper surface of the package substrate 800 to each other. The lower and upper pads 812 and 811 and the redistribution circuit 813 may include a metal, for example, at least one of copper (Cu), aluminum (Al), nickel (Ni), silver (Ag), or gold (Au), at least one metal of platinum (Pt), tin (Sn), lead (Pb), titanium (Ti), chromium (Cr), palladium (Pd), indium (In), zinc (Zn), and carbon (C), or alloys including at least two thereof. The redistribution circuit 813 may include multilayer redistribution lines and redistribution vias connecting the multilayer redistribution lines to each other. An external connection terminal 820, connected to the lower pad 812, may be disposed on the lower surface of the package substrate 800. The external connection terminal 820 may include tin (Sn), indium (In), bismuth (Bi), antimony (Sb), copper (Cu), silver (Ag), zinc (Zn), lead (Pb), and/or alloys thereof.

The interposer substrate 700 may include a substrate 701, a lower passivation layer 703, a lower pad 705, an interconnection layer 710, an upper pad 704, a bump 720, and a through-electrode 730. The semiconductor structure 1000A and the semiconductor chip 900 may be stacked on the package substrate 800 via the interposer substrate 700. The interposer substrate 700 may electrically connect the semiconductor structure 1000A and the semiconductor chip 900 to each other.

The substrate 701 may be formed of, for example, one of silicon, an organic material, a plastic, and a glass substrate. When the substrate 701 is a silicon substrate, the interposer substrate 700 may be referred to as a silicon interposer. When the substrate 701 is an organic substrate, the interposer substrate 700 may be referred to as a panel interposer.

The lower passivation layer 703 may be disposed on a lower surface of the substrate 701, and the lower pad 705 may be disposed on the lower passivation layer 703. The lower pad 705 may be connected to the through-electrode 730. The semiconductor structure 1000A and the semiconductor chip 900 may be electrically connected to the package substrate 800 through the bump 720 disposed on the lower pad 705.

The interconnection layer 710 may be disposed on an upper surface of the substrate 701 and may include an interlayer insulating layer 711 and a single-layer or multi-layer interconnection structure 712. When the interconnection layer 710 has a multilayer interconnection structure, interconnections of different layers may be connected to each other through vertical contacts.

The upper pad 704 may be disposed on the interconnection layer 710.

The through-electrode 730 may extend from the upper surface to the lower surface of the substrate 701 to penetrate through the substrate 701. The through-electrode 730 may extend inwardly of the interconnection layer 710 to be electrically connected to the interconnections of the interconnection layer 710. When the substrate 701 is silicon, the through-electrode 730 may be referred to as a through-silicon via. A structure and a material of the through-electrode 730 are the same as those of the through-silicon via 120 described in the semiconductor package 1000A of FIG. 1. According to an example embodiment, the interposer substrate 700 may include only an interconnection layer therein, but may not include a through-electrode.

The interposer substrate 700 may be used for the purpose of converting or transferring an input electrical signal between the package substrate 800 and the semiconductor structure 1000A or the semiconductor chip 900. Accordingly, the interposer substrate 700 may not include devices such as active devices or passive devices. According to an example embodiment, the interconnection layer 710 may be disposed below the through-electrode 730. For example, a positional relationship between the interconnection layer 710 and the through-electrode 730 may be relative.

The bump 720 may be disposed on a lower surface of the interposer substrate 700 and may be electrically connected to the interconnection of the interconnection layer 710. The interposer substrate 700 may be stacked on the package substrate 800 through the bump 720. The bump 720 may be connected to the lower pad 705 through the interconnections of the interconnection layer 710 and the through-electrode 730. In an example, among the lower pads 705, some lower pads 705 used for power or ground may be integrated and connected to the bumps 720, so that the number of the lower pads 705 may be greater than the number of the bumps 720.

The semiconductor chip 900 may include a logic chip such as a central processing unit (CPU), a graphics processing unit (GPU), a field programmable gate array (FPGA), a digital signal processor (DSP), a cryptographic processor, a microprocessor, a microcontroller, an analog-to-digital converter, an application-specific integrated circuit (ASIC), or the like.

The semiconductor package 10000 according to an example embodiment may further include an internal encapsulant disposed on the interposer substrate 700 to cover side and upper surfaces of the semiconductor structure 1000A and the semiconductor chip 900. In addition, the semiconductor package 10000 may further include an external encapsulant disposed on the package substrate 800 to cover the interposer substrate 700 and the internal encapsulant. In some embodiments, the external encapsulant and the internal encapsulant may be formed together, such that they may not be distinguished from each other. In some embodiments, the internal encapsulant may cover only the upper surface of the semiconductor chip 900 and may not cover the upper surface of the semiconductor structure 1000A.

A method of manufacturing the semiconductor package illustrated in FIGS. 3 and 4 will be described with reference to FIGS. 8 to 15. FIGS. 8 to 15 are schematic cross-sectional views illustrating a method of manufacturing a package substrate illustrated in FIGS. 3 and 4. In FIGS. 8 to 15, the same reference numerals as those of FIGS. 3 and 4 have characteristics the same as or similar to the above-described characteristics, so that redundant descriptions will be omitted.

Figure 8:
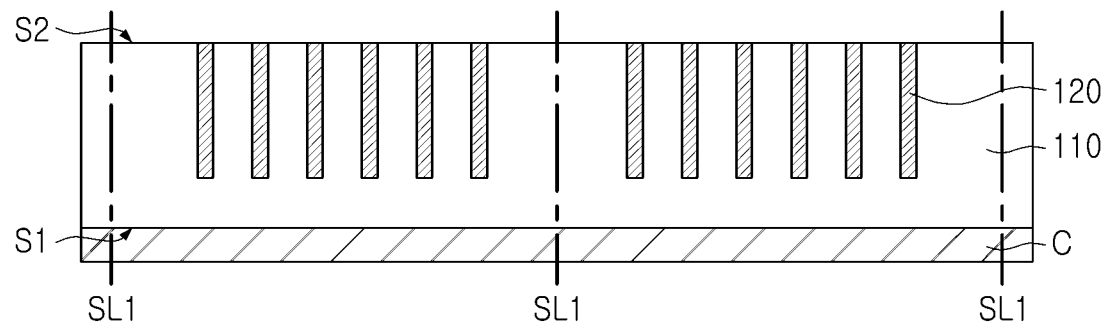
FIGS. 8 to 15 are schematic cross-sectional views illustrating a method of manufacturing a package substrate illustrated in FIGS. 3 and 4.

Referring to FIG. 8, a second substrate 110 in a wafer state may be attached to a carrier C, and a through-silicon via 120 may be formed to extend inwardly of the second substrate 110. The carrier C may be a resin substrate or a glass substrate including an adhesive layer. In an example, the carrier C may be a dummy wafer. The second substrate 110 may be divided into unit devices by a first scribe lane SL1. The through-silicon via 120 may extend inwardly from a second surface S2 of the second substrate 110. The through-silicon via 120 may be formed so as not to be exposed on the second surface S2 of the second substrate 110. The through-silicon via 120 may be formed in a pillar shape to fill a via hole, and may include a barrier layer, formed on a surface of the pillar shape, and a buried conductive layer filling an inside of the barrier layer. The through-silicon via 120 may be formed using an etching process to form a via hole, an oxidation process and a plating process to form a barrier layer and a buried conductive layer in the via hole, a planarization process, and the like.

Figure 9:
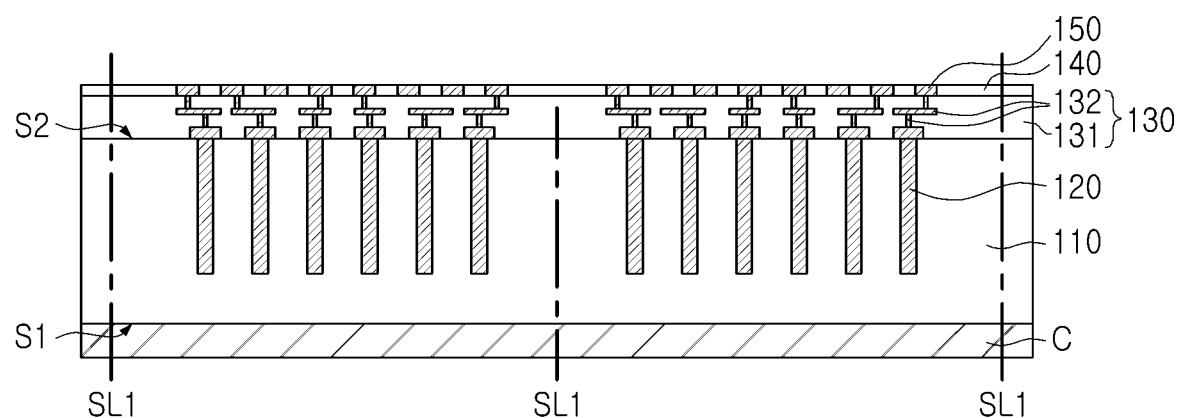

Referring to FIG. 9, a second device layer 130, a second insulating layer 140, and a second electrode pad 150 may be formed on the second surface S2 of the second substrate 110. The second device layer 130 may be formed by repeatedly performing an oxidation process, a photolithography process, an etching process, a plating process, and the like. The second electrode pad 150 may be formed on the second device layer 130. The second electrode pad 150 may be formed by depositing at least one of aluminum (Al), copper (Cu), nickel (Ni), tungsten (W), platinum (Pt), and gold (Au).

Next, a second substrate 110 in a wafer state may be diced in units of individual devices along the first scribe lane SL1.

Figure 10:
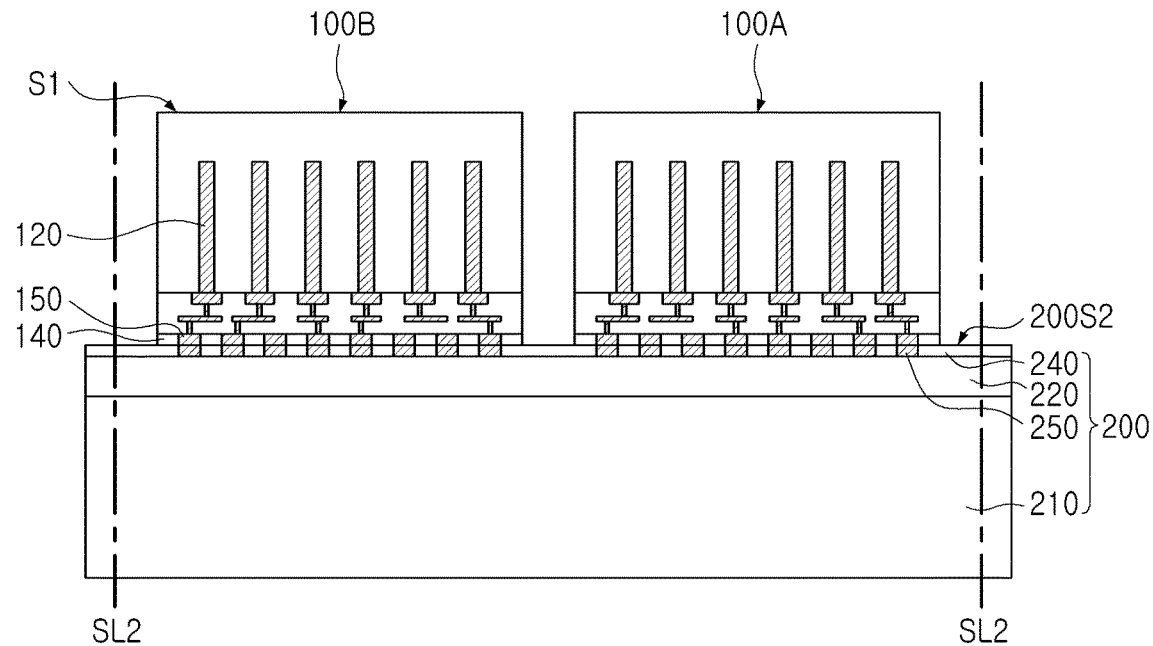

Referring to FIG. 10, the diced second semiconductor chip 100A and the diced third semiconductor chip 100B may be attached to an upper surface 200S2 of the first semiconductor chip 200 in a wafer state. The second and third semiconductor chips 100A and 100B may each be disposed such that the first surface S1 is directed upwardly. The second semiconductor chip 100A and the third semiconductor chip 100B may be directly bonded to the first semiconductor chip 200 in a wafer state without an additional adhesive member and an additional connection member. The first semiconductor chip 200 in a wafer state may be divided into individual device units by a second scribe lane SL2.

According to an example embodiment, the bonding of the second semiconductor chip 100A and the third semiconductor chip 100B to the first semiconductor chip 200 may be performed through a process of placing the second semiconductor chip 100A and the third semiconductor chip 100B on the first semiconductor chip 200 and applying pressure to the second and third semiconductor chips 100A and 100B in a temperature atmosphere higher than room temperature, for example, a thermal atmosphere of about 200° C. to about 300° C. In this process, a first electrode pad 250 of the first semiconductor chip 200 may be bonded and coupled to the second electrode pad 150 of the second semiconductor chip 100A and the third semiconductor chip 100B, and a first insulating layer 240 of the first semiconductor chip 200 may be bonded and coupled to a second insulating layer 140 of the second semiconductor chip 100A and the third semiconductor chip 100B. In this case, a temperature of the thermal atmosphere is not limited to about 200° C. to about 300° C. and may vary. The first electrode pad 250 and the second electrode pad 150 may be bonded to each other through metal diffusion, and the first insulating layer 240 and the second insulating layer 140 may be bonded to each other through a covalent bond.

Figure 11:
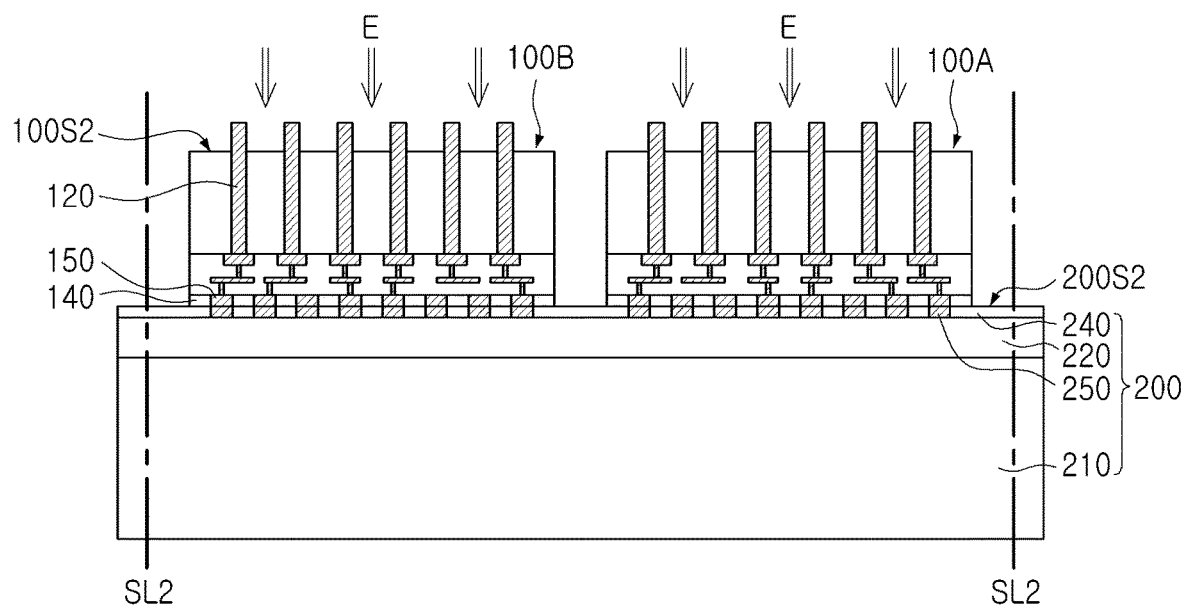

Referring to FIG. 11, the upper surfaces 100S2 of the second semiconductor chip 100A and the third semiconductor chip 100B may be subjected to wet etching E to expose the through-silicon vias 120.

Figure 12:
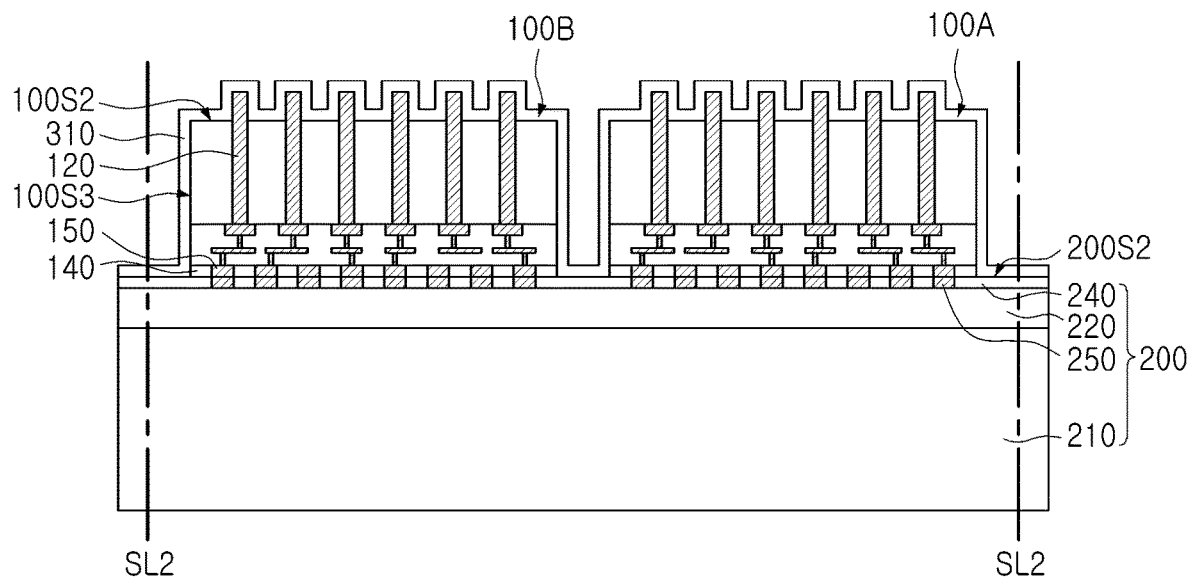

Referring to FIG. 12, a first encapsulation layer 310 may be formed to surround a side surface of the through-silicon via 120. In some example embodiments, the first encapsulation layer 310 may be formed to cover an upper surface 200S2 of the first semiconductor chip 200 and to cover an upper surface 100S2 and a side surface 100S3 of the second and third semiconductor chips 100A and 100B. The first encapsulation layer 310 may be formed by depositing silicon oxide or silicon nitride. In some example embodiments, after the first encapsulation layer 310 is formed, a trench may be further formed to divide the first semiconductor chip 200 in a wafer state into individual device units along the second scribe lane SL2. Such a trench may remain as a recess in a peripheral region of the first semiconductor chip 200 after the first semiconductor chip 200 in a wafer state is diced in units of individual devices.

Figure 13:
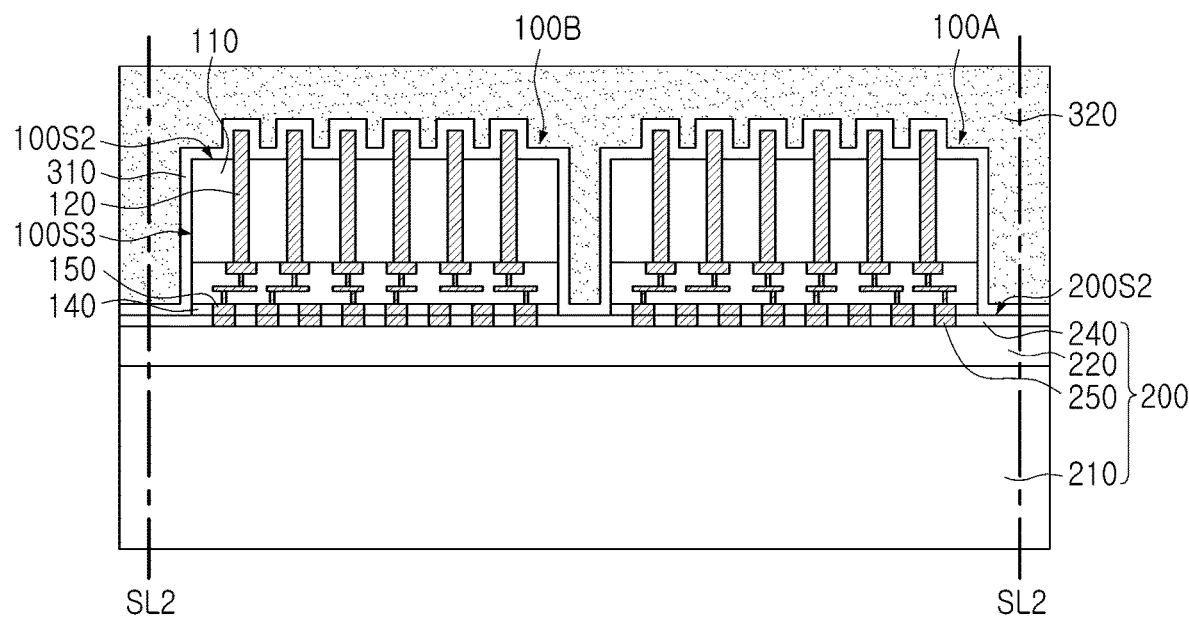

Referring to FIG. 13, a second encapsulation layer 320 may be formed to cover the first encapsulation layer 310. The second encapsulation layer 320 may be formed by applying a material in which an inorganic filler is mixed with an organic resin. The second encapsulation layer 320 may be applied at a thickness sufficient to cover the first encapsulation layer 310 and to cover the second semiconductor chip 100A and the third semiconductor chip 100B.

Figure 14:
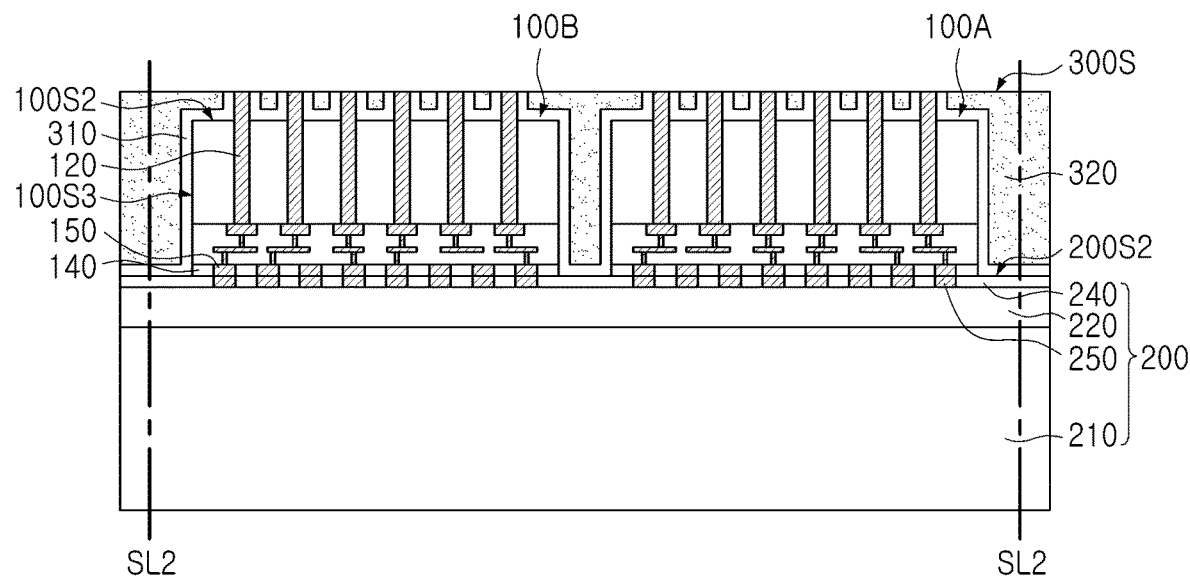

Referring to FIG. 14, an upper surface of the second encapsulation layer 320 may be planarized to expose the through-silicon via 120. For example, the planarization may be performed by a mechanical polishing process such as a grinding process. The planarization may be performed within a range in which the second substrate 110 is not exposed while the through-silicon via 120 is exposed.

Figure 15:
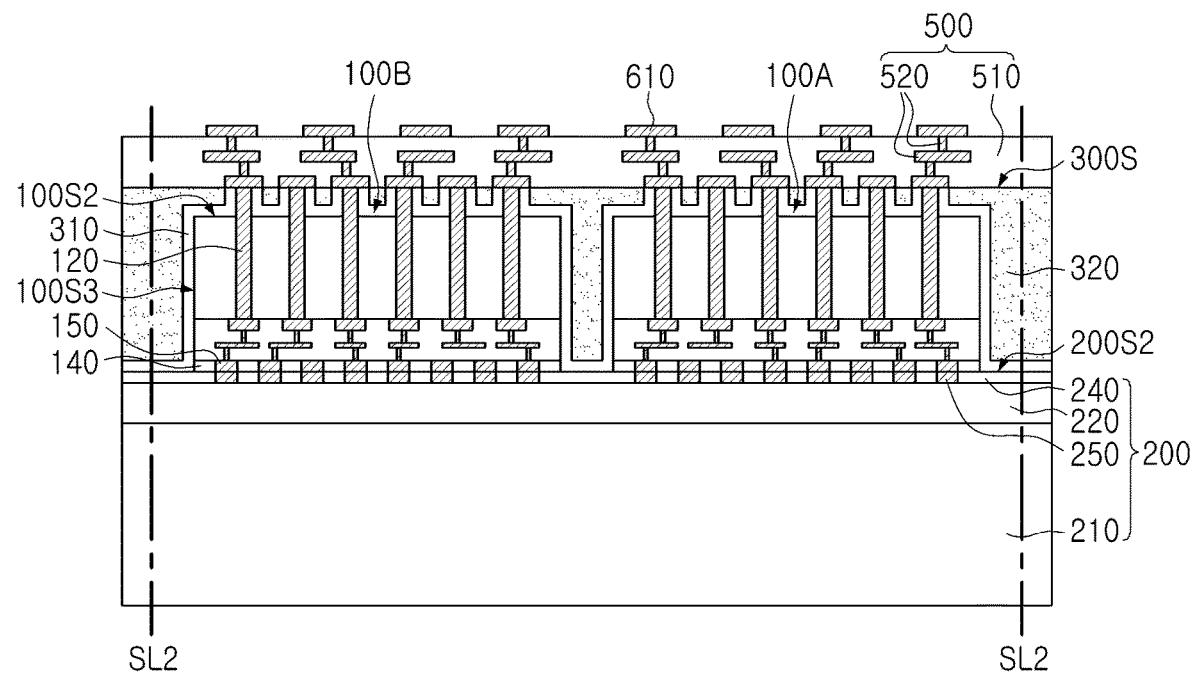

Referring to FIG. 15, a redistribution structure 500 and a lower electrode pad 610 may be formed on the second encapsulation layer 320. The redistribution structure 500 may be formed by performing a photolithography process, a plating process, or the like. Next, connection bumps may be formed on the lower electrode pad 610 to complete the semiconductor package of FIG. 1.

As described above, a method of manufacturing a semiconductor package, having reliability improved by an encapsulation layer formed of a high-modulus material, may be provided.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor package, the method comprising:
   forming a first insulating layer and a first electrode pad, penetrating through the first insulating layer, on a first surface of a semiconductor substrate including a plurality of through-silicon vias, to form a semiconductor chip;
   forming a second insulating layer and a second electrode pad, penetrating through the second insulating layer, on an upper surface of a semiconductor wafer;
   bonding the first insulating layer and the first electrode pad of the semiconductor chip to the second insulating layer and the second electrode pad of the semiconductor wafer, respectively, to mount the semiconductor chip on the semiconductor wafer;
   etching an upper surface of the semiconductor chip to expose the plurality of through-silicon vias;
   covering the plurality of exposed through-silicon vias with a first material to form a first encapsulation layer;
   covering the first encapsulation layer with a second material, including an organic resin and an inorganic filler, to form a second encapsulation layer;
   grinding an upper surface of the second encapsulation layer to expose the plurality of through-silicon vias, while leaving a portion of the second encapsulation layer between the plurality of through-silicon vias; and
   forming a redistribution structure, electrically connected to the plurality of exposed through-silicon vias, on the upper surface of the second encapsulation layer.

2. The method of claim 1, further comprising:
   before the second encapsulation layer is formed, removing a first region of the semiconductor wafer and the first insulating layer to form a trench dividing the semiconductor wafer in units of individual devices.

3. The method of claim 2, wherein, in the forming the second encapsulation layer, the trench is filled with the second material.

4. The method of claim 1, wherein the first material is different from the second material.

5. The method of claim 4, wherein the second material includes an inorganic material.

6. The method of claim 5, wherein the inorganic material includes at least one of silicon oxide or silicon nitride.

7. The method of claim 1, wherein the first material includes a same material as the second material, and the same material includes SiOx.

8. The method of claim 1, further comprising:
   after the forming the redistribution structure, dicing the second encapsulation layer and the semiconductor wafer.

9. The method of claim 1, wherein the semiconductor wafer includes a plurality of circuit patterns;
   the semiconductor chip includes a plurality of semiconductor chips; and
   at least one of the plurality of semiconductor chips is mounted on each of the plurality of circuit patterns.

10. The method of claim 9, wherein the plurality of circuit patterns include a logic circuit; and
each of the plurality of semiconductor chips includes at least one of an input/output circuit, an analog circuit, a memory circuit, or a serial-to-parallel conversion circuit for the logic circuit.

11. The method of claim 10, wherein the logic circuit includes at least one of a central processing unit (CPU), a graphics processing unit (GPU), a field programmable gate array (FPGA), a digital signal processor (DSP), an image signal processor (ISP), a cryptographic processor, a microprocessor, a microcontroller, an analog-to-digital converter, or an application-specific integrated circuit (ASIC).

12. The method of claim 1, wherein the second material is provided on a side of a substrate of semiconductor wafer.

13. A method of manufacturing a semiconductor package, the method comprising:
hybrid-bonding a semiconductor chip, including a through-silicon via, to an upper surface of a semiconductor wafer;
wet-etching a surface of the semiconductor chip to expose the through-silicon via;
covering the exposed through-silicon via and a side surface of a substrate of the semiconductor chip with a material, including an organic resin and an inorganic filler, to form an encapsulation layer;
removing an upper surface of the encapsulation layer to expose the through-silicon via; and
forming a redistribution structure electrically connected to the through-silicon via.

14. The method of claim 13, further comprising:
covering the exposed through-silicon via with an another material, different from the material of the encapsulation layer, to form a passivation layer, before the encapsulation layer is formed.

15. The method of claim 13, further comprising:
before the encapsulation layer is formed, removing a first region of the upper surface of the semiconductor wafer to form a trench dividing the semiconductor wafer in units of individual devices.

16. The method of claim 13, wherein the removing the upper surface of the encapsulation layer to expose the through-silicon via comprises grinding the upper surface of the encapsulation layer.

17. The method of claim 13, further comprising:
providing the material directly on the exposed through-silicon via and the substrate of the semiconductor chip.

18. A method of manufacturing a semiconductor package, the method comprising:
forming a first insulating layer and a first electrode pad, penetrating through the first insulating layer, on a first surface of a semiconductor substrate including a through-silicon via, to form a semiconductor chip;
forming a second insulating layer and a second electrode pad, penetrating through the second insulating layer, on an upper surface of a semiconductor wafer;
bonding the first insulating layer and the first electrode pad of the semiconductor chip to the second insulating layer and the second electrode pad of the semiconductor wafer, respectively, to mount the semiconductor chip on the semiconductor wafer;
etching an upper surface of the semiconductor chip to expose the through-silicon via;
covering the exposed through-silicon via and a side surface of the substrate of the semiconductor chip with a material, including an organic resin and an inorganic filler, to form an encapsulation layer;
removing an upper portion of the encapsulation layer to expose the through-silicon via; and
forming a redistribution structure, electrically connected to the exposed through-silicon via, on the upper surface of the encapsulation layer.

19. The method of claim 18, wherein the encapsulation layer includes an epoxy molding compound (EMC).

20. The method of claim 19, wherein the inorganic filler includes at least one of silicon oxide or silicon nitride.

* * * * *